United States Patent [19]
Appelt et al.

[11] Patent Number: 5,977,642
[45] Date of Patent: Nov. 2, 1999

[54] DENDRITE INTERCONNECT FOR PLANARIZATION AND METHOD FOR PRODUCING SAME

[75] Inventors: Bernd K. Appelt, Apalachin; Saswati Datta, Binghamton; Michael A. Gaynes, Vestal; John M. Lauffer, Waverly; James R. Wilcox, Vestal, all of N.Y.

[73] Assignee: International Business Machines Corporation, Armonk, N.Y.

[21] Appl. No.: 08/918,085

[22] Filed: Aug. 25, 1997

[51] Int. Cl.[6] .......................... H01L 23/48; H01L 23/52; H01L 29/40
[52] U.S. Cl. ............................................ 257/780; 257/739
[58] Field of Search .................... 257/778, 739, 257/758, 740, 780, 781; 361/771, 774, 779; 174/261

[56] References Cited

U.S. PATENT DOCUMENTS

| | | | |
|---|---|---|---|
| 3,359,145 | 12/1967 | Salyer | 156/1 |
| 4,151,543 | 4/1979 | Hayakawa et al. | 257/739 |
| 4,157,932 | 6/1979 | Hirata | 156/310 |
| 4,704,367 | 11/1987 | Alvis et al. | 257/739 |
| 4,922,320 | 5/1990 | McDavid | 257/739 |
| 4,937,653 | 6/1990 | Blonder et al. | 257/739 |
| 5,019,944 | 5/1991 | Ishii et al. | |
| 5,137,461 | 8/1992 | Bindra et al. | |
| 5,214,307 | 5/1993 | Davis | 257/783 |
| 5,298,685 | 3/1994 | Bindra et al. | 174/250 |
| 5,371,654 | 12/1994 | Beaman et al. | |
| 5,435,057 | 7/1995 | Bindra et al. | |
| 5,509,200 | 4/1996 | Frankeny et al. | 29/852 |
| 5,600,103 | 2/1997 | Odaira et al. | |
| 5,745,333 | 4/1998 | Frankeny et al. | |
| 5,759,047 | 6/1998 | Brodsky et al. | |

FOREIGN PATENT DOCUMENTS 1 568 464  2/1978  United Kingdom .

*Primary Examiner*—Sheila V. Clark
*Attorney, Agent, or Firm*—James A. Lucas

[57] ABSTRACT

A method is provided for connecting two conductive surfaces in an electronic circuit package comprising the steps of forming dendrites on selected regions of a first conductive surface, applying a dielectric insulation material over the first conductive surface such that the dendrites are exposed through the insulation material to leave a substantially planar surface of exposed dendrites, and placing a second conductive surface on top of the exposed dendrites. The second conductive surface may be a surface metal, a chip bump array, or a ball grid array. Also claimed is an electronic circuit package incorporating the dendrites used for electrical interconnection and planarization manufactured in accordance with the present invention.

21 Claims, 2 Drawing Sheets ns with dendrites connecting two conductive surfaces and
method for producing same. The dendrites electrically con-
nect the two conductive surfaces and provide coplanarity
such that planarization process steps can be eliminated.

DENDRITE INTERCONNECT FOR PLANARIZATION AND METHOD FOR PRODUCING SAME

TECHNICAL FIELD OF THE INVENTION

The present invention relates to electronic circuit pack-
ages with dendrites connecting two conductive surfaces and
method for producing same. The dendrites electrically con-
nect the two conductive surfaces and provide coplanarity
such that planarization process steps can be eliminated.

BACKGROUND OF THE INVENTION

Electronic circuits contain many (sometimes millions) of
components such as resistors, capacitors, inductors, diodes,
electromechanical switches, and transistors. High density
packaging of electronic components is particularly impor-
tant to allow fast access to large amounts of data in com-
puters. High density electronic circuit packages also are
important in high frequency devices and communications
devices. The components are connected to form circuits and
circuits are connected to form functioning devices. The
connections perform power and signal distribution. In a
multi-layer electronic circuit package, some layers of the
package serve as power planes and other layers serve as
signal planes, depending on the operational requirements of
the device. The devices require mechanical support and
structural protection. The circuits themselves require elec-
trical energy to function. The functioning devices, however,
produce heat, or thermal energy which must be dissipated so
that the devices do not stop functioning. Moreover, while
high density packaging of a number of components can
improve performance of the device, the heat produced by the
power-consuming components can be such that performance
and reliability of the devices is adversely impacted. The
adverse impact arises from electrical problems such as
increased resistivity and mechanical problems such as ther-
mal stress caused by increased heat.

Electronic circuit packages, such as chips, modules, cir-
cuit cards, circuit boards, and combinations of these, thus
must meet a number of requirements for optimum perfor-
mance. The package must be structurally sturdy enough to
support and protect the components and the wiring. In
addition, the package must be capable of dissipating heat
and must have a coefficient of thermal expansion that is
compatible with that of the components. Finally, to be
commercially useful, the package should be inexpensive to
produce and easy to manufacture.

High density packages necessarily involve increased wir-
ing density and thinner dielectric coatings between layers in
a multi-layer electronic circuit package. The layers in a
multi-layer package typically are electrically connected by
vias and through-holes. The term "via" is used for a con-
ductive pathway between adjacent layers in a multi-layer
electronic circuit package. The term "through-hole" is used
for a conductive pathway that extends to a non-adjacent
layer. For high density packages the through-holes are
increasingly narrow in diameter and the through-holes in
each layer must be aligned precisely. This invention pro-
vides an alternative means of interconnection—namely elec-
trical interconnection using dendrites.

Furthermore, in creating a multi-layer electronic circuit
package, particularly an organic package, metal circuits on
the surface contribute to non-planar surfaces in the manu-
facturing process. To solve the problem of non-planar
surfaces, many techniques of planarization are known in the
art. However, these techniques require added processing
steps. An object of this invention is to provide "automatic"
planarization by means of dendrites used for interconnection
between conductive layers of the electronic circuit package
such that the need for additional planarization steps in the
manufacturing process is eliminated.

SUMMARY OF THE INVENTION

It is an object of this invention to provide an electronic
circuit package with dendrites forming electrical connec-
tions between a first conductive layer and second conductive
layer.

A further object of this invention is to provide an elec-
tronic circuit package that is inherently planarized using
dendrites, thereby eliminating the need for planarization
steps in the manufacturing process of the electronic circuit
package.

A third object of this invention is to provide methods of
fabrication of electronic circuit packages with dendrites
forming electrical connections between a first conductive
layer and a second conductive layer.

A fourth object of this invention is to provide an electronic
circuit package and method for producing said package with
dendrites forming electrical connections between a first
conductive layer and a second conductive layer that is a ball
grid array.

Accordingly, a method is provided for connecting two
conductive layers in an electronic circuit package compris-
ing the steps of forming dendrites on selected regions of a
first conductive layer, applying an insulation material over
the first conductive layer such that the dendrites are exposed
through the insulation material to leave a substantially
planar surface of exposed dendrites, and placing a second
conductive layer on top of the exposed dendrites. Also
claimed is an electronic circuit package incorporating the
dendrites used for electrical interconnection and planariza-
tion manufactured in accordance with the present invention.

It is an advantage of the present invention that the
dendrites provide electrical connection between two con-
ductive layers of the electronic circuit package.

It is a further advantage that the dendrites provide a
substantially planar surface for attachment of the second
conductive layer without the need for additional planariza-
tion steps in the process of manufacturing the electronic
circuit package.

Other features and advantages of the present invention
will become apparent in the following detailed description
of the preferred embodiment of the invention taken in
conjunction with the accompanying drawings and examples.

DETAILED DESCRIPTION OF THE INVENTION

The present invention is of an electronic circuit package
using dendrites to provide connection between two conductive circuits and using dendrites for the added advantage of inherent planarization such that planarization steps can be removed from the manufacturing process. The invention can best be understood by reference to the drawings.

Figure 1:
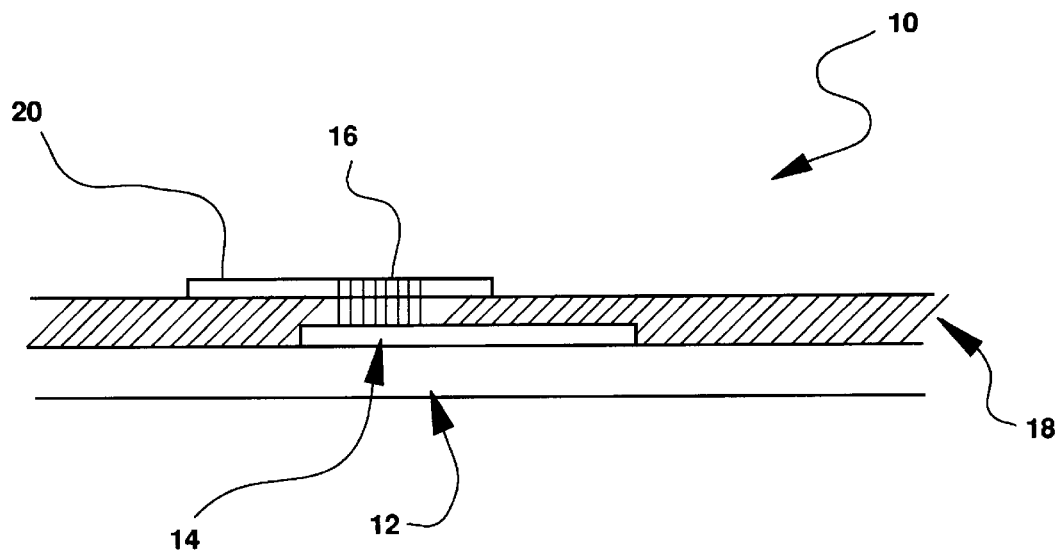
FIG. 1 is a depiction of a single layer of a multi-layer
electronic circuit package using dendrites for electrical
connections and planarization, in accordance with the
present invention.

FIG. 1 illustrates a sample layer 10 of an electronic circuit package in accordance with the present invention. Referring to FIG. 1, at the bottom of the layer 10 is a substrate 12 such as a PCB-core or subcomposite. The substrate 12 is preferably an organic substance such as epoxy/glass, bismaleimide triazine, cyanate ester, polyimide or PTFE. A first surface metal 14 is situated on top of the substrate 12 and covers some portion of the upper surface of substrate 12. The first surface metal 14 is used for circuit wires or vias (not shown) that protrude approximately 1 ail above the surface. The first surface metal 14 forms a first conductive surface. In the preferred embodiment of the invention, the first surface metal 14 is of a copper material, typically 0.5–1.4 mils thick. Other suitable materials for the first surface metal 14 include, but are not limited to, copper with nickel or nickel and gold overplate, as well as copper over nickel or chrome.

Dendrites 16 are applied at selected locations on the surface metal 14. The dendrites 16 preferably are made of palladium metal. Palladium metal possesses desired mechanical and physical properties. Other suitable metals for the dendrites include, but are not limited to, nickel, copper, platinum, or tungsten.

The dendrites may be formed by a variety of methods. One such method is to apply a photoresist material to the area of surface metal 14 and then expose and develop the resist (not shown) by photolithographic techniques to provide an exposed area on which the dendrites are to be formed.

Typical photoresist materials are methacrylate polymeric resist compositions and electrophoretic resists such as those obtainable from Shipley or Nippon Paint.

According to a preferred method, an intermediate layer of nickel (not shown) is electroplated onto the first surface metal 14 followed by an intermediate layer of palladium, after applying resist material.

The nickel layer is typically about 1 to about 2.5 microns and more typically about 2 microns thick. The nickel covers the first surface metal 14 to prevent it from contaminating the palladium plating composition.

In addition this intermediate layer of palladium is typically about 1 to about 2.5 microns and more typically about 2 microns thick. Typical compositions and parameters for electroplating these layers of palladium are 100 millimolar solution of palladium and 10 mA/sq.cm.

The dendrites 16 then are formed on the intermediate palladium layer by any known technique such as by ultrasonic plating of palladium typically at about 80 to 100 milliamps/cm$^2$ of surface area of first surface metal 14. Typical palladium compositions are 150 millimolar palladium tetramaine-chloride at ph 9 and a current density of 5 mA/cm$^2$ for about 30 minutes followed by pulse plating at 800 mA/cm$^2$ peak current at a 10% duty cycle of 1 millisecond pulse on time, 9 millisecond pulse off time in a solution of 15 millimolar palladium ammine chloride at ph 9 in 5 molar ammonium chloride with intermittent ultrasonic agitation until 80% of the desired dendrite height is reached. U.S. Pat. No. 5,188,073. The dendrites are then overplated by palladium under the first conditions to provide mechanical strength to the dendrites. It is preferred that the dendrites 16 are about 2 mil in height. If desired, each of the dendrites 16 can be coated with a metal that could interface with or diffuse to form a metallic bond. For instance, the dendrites 16 can be coated with pure gold or with tin.

The photoresist is then removed by stripping in a suitable solvent such as propylene carbonate.

Next, a layer of curable dielectric resist 18 is applied across the upper surface of substrate 12. The resist 18 thus covers the substrate 12, the first surface metal 14 and the lower portion of the dendrites 16. In the preferred embodiment of the invention, the dendrites 16 typically would extend beyond the top of the layer of resist 18. The amount of protrusion in the preferred embodiment of the invention is approximately 0.1 to 0.5 mils more typically, approximately 5 mils.

The dielectric resist 18 may be any type of dielectric material from standard liquid epoxy, polyimide, Teflon, cyanate resins, powdered resin materials, or filled resin systems exhibiting enhanced dielectric constants. Coating of the dielectric material is performed with any number of methods known in the industry such as roller, draw, powder or curtain coating, electrostatic or electrophoretic deposition, screen printing, spraying, dipping or transfer of a dry film. Any of these coating methods is capable of providing uniformly thin films. In the preferred embodiment of the invention, the dielectric is Morton LB 404 applied by vacuum lamination. The ASM is applied to a thickness of about 2.5 mil.

A second surface metal 20, forming a second conductive layer then is applied on top of the layer of dendrites 16 and dielectric resist 18. The top of the layer of dendrites 16 is inherently substantially planar. For this reason the second surface metal 20 easily is applied. There is no need to provide for pre-drilled holes in the second conductor layer or in the dielectric to accommodate the dendrites 16. Any technique known in the art such as sputtering, plating, or laminating may be used to attach the second surface metal 20. The second surface metal 20 may be made of copper or copper over nickel or chrome. In the preferred embodiment of the invention, the second surface metal 20 is a copper foil that is 0.3 to 2 mils thick.

After application of the second surface metal 20, the dielectric resist 18 is fully cured by baking at the appropriate temperature and time. In the case of Morton LB 404, 2 hours at 200° C. is a typical cure bake.

The second surface metal 20 then can be circuitized such as by etching through photoresist to result in circuits (not shown) on the upper surface of the second surface metal 20.

The entire process can be repeated to create more layers interconnected by dendrites as described above.

The advantages of the dendrites 16 shown in FIG. 1 are two-fold. First, since after coating with dielectric 18 the dendrites 16 form an inherently planar surface, no planarization step is needed in the manufacturing process prior to applying the second surface metal 20. Second, the dendrites 16 provide an electrical connection between the first surface metal 14 and the second surface metal 20 without the need for plated through holes or plated vias.

Figure 2:
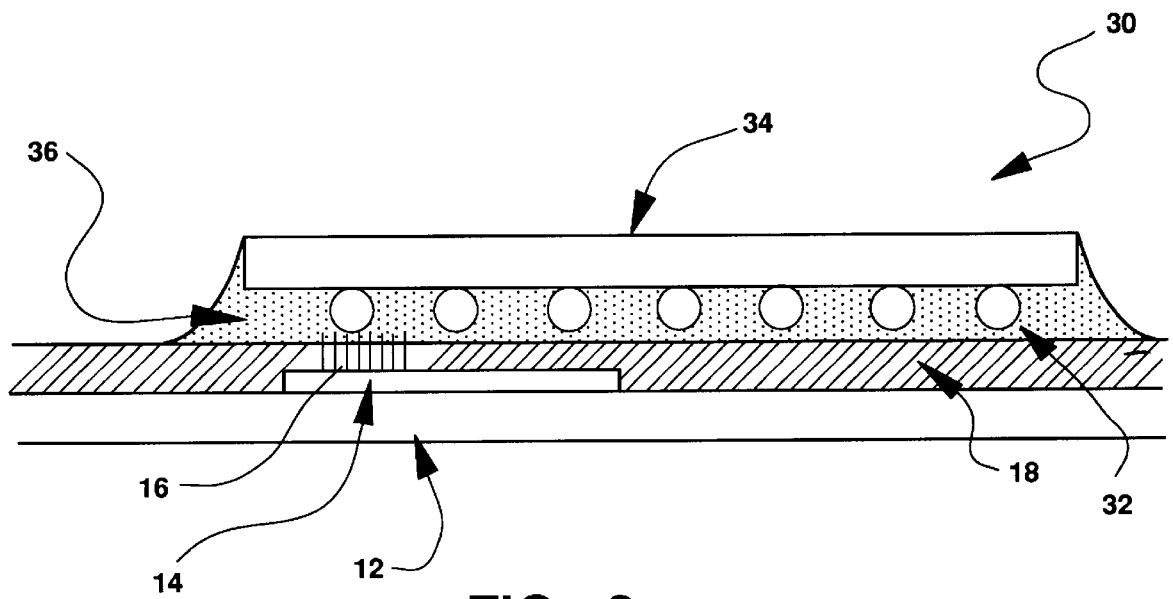
FIG. 2 is a depiction of a second alternative embodiment
of a single layer of a multi-layer electronic circuit package
showing direct connect of a chip to a substrate by means of
a solder ball array and dendrite pads in accordance with the
present invention.

FIG. 2 shows an alternative embodiment of the invention. FIG. 2 shows a single layer 30 of a multi-layer circuit board. In FIG. 2, the substrate 12, first surface metal 14, dendrites 16, and dielectric layer 18 are as in FIG. 1. The second conductive layer in FIG. 2, however, is an array 32 of chip bumps, preferably C4 solder balls. Alternatively, the array 32 may be a ball grid array. The connecting bumps can also be of gold, nickel or a suitable conductive adhesive.

The use of spherical shaped balls or bumps in electronic modules is well-known in the art. With the increase in the number of input/output leads extending from electronic devices, such as integrated circuits, ball grid array (BGA)

packages have been developed. A BGA package is a type of packaged electronic device in which at least one electronic device, such as an integrated circuit chip, is mounted to a substrate and an electrical connection to an electrically conductive material not part of the packaged electronic device, such as a printed circuit board (PCB), is made by an array of solder balls located on a surface of the substrate.

As shown in FIG. 2, a chip 34 can be electrically connected to the first surface metal 14 by means of the array 32 and the dendrites 16. The connection between the chip 34 and the first surface metal 14 can be by mechanical force. Alternatively, the area under the chip 34 can be filled with an organic curable adhesive 36. When the adhesive cures, the mechanical force then can be removed. A suitable adhesive 36 is an epoxy or a cyanate ester filled with ceramic particles. The preferred underfill material is Dexter FP 4511. The use of underfill materials to stabilize C4 and BGA connections is well known.

Alternately, a chip having gold stud bumps may be thermosonically bonded directly to palladium dendrites having a gold flash layer, thereby further stabilizing the electrical chip interconnection. This enhancement permits underfill dispense and cure without an applied mechanical force.

A second option for acheiving a metallurgical chip interconnection comprises the use of a tin coated C4 solder bump which can be soldered directly to the palladium dendrites. This option also permits underfill dispense and cure without an applied mechanical force.

The arrangement shown in FIG. 2 has several advantages. A first advantage is that no solder mask is required to define the connection pads, thus eliminating the photolithographic process and associated registration concerns. A second advantage is that the connection is made by small forces eliminating the need for solder reflow and avoiding concomitant thermal stresses. A third advantage is that the chip is reworkable with an appropriate reworkable adhesive.

Figure 3:
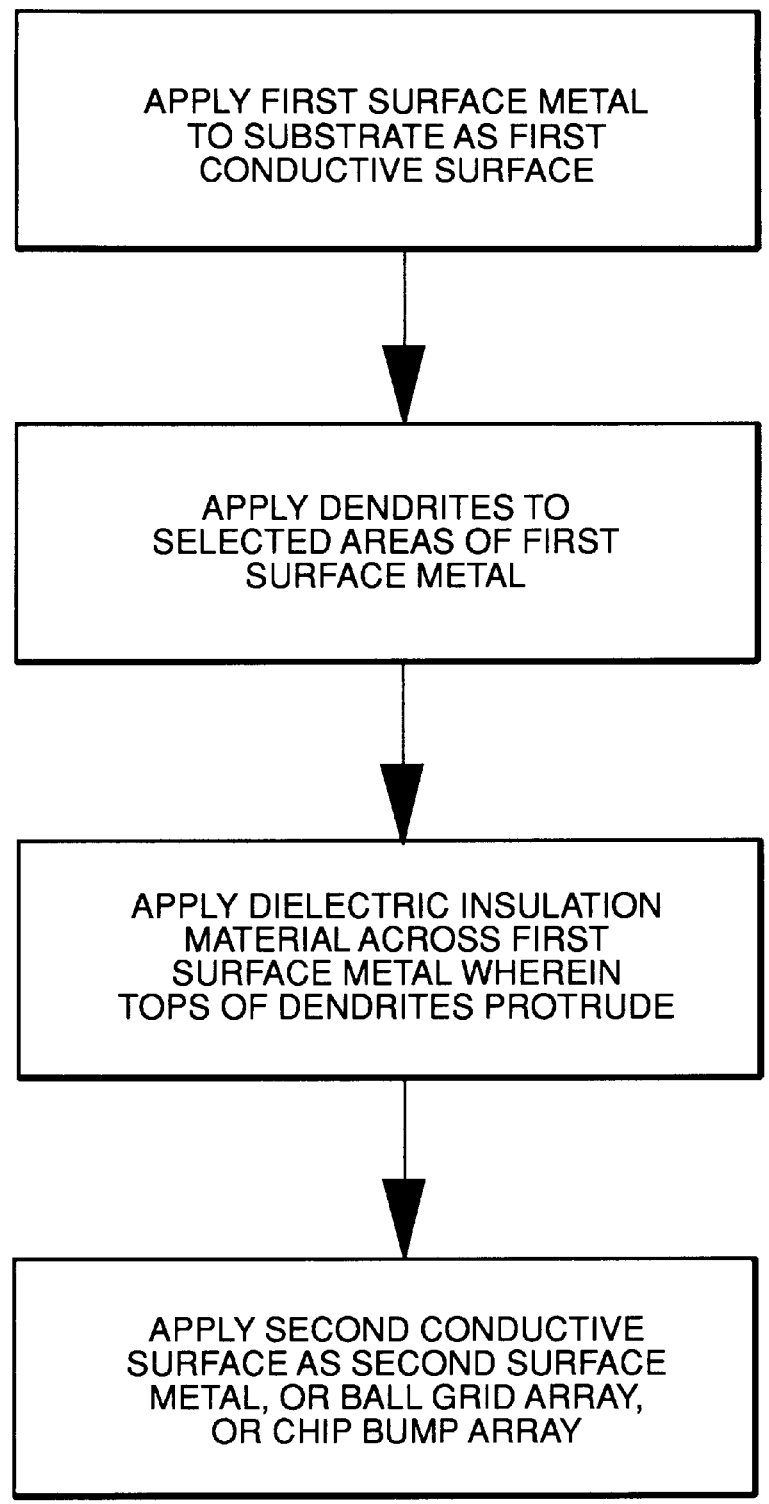
FIG. 3 is a flow chart of the method of the present
invention.

FIG. 3 is a flow chart in accordance with the method of the present invention.

Although specific embodiments have been described herein for purposes of illustration, various modifications may be made without departing from the spirit or scope of the invention.

What is claimed is:

1. An electronic circuit package comprising:
   a substrate;
   a first surface metal forming a first conductive surface on top of the substrate;
   conductive dendrites formed on selected areas of the first surface metal;
   dielectric insulation material covering the first surface metal and having a top through which the tops of the dendrites protrude approximately 0.1 to 0.5 mil, and
   a second conductive surface on top of the dendrites.

2. The electronic circuit package of claim 1, wherein the first surface metal is made of a copper material.

3. The electronic circuit package of claim 1, wherein the substrate is made of an organic material.

4. The electronic circuit package of claim 1, wherein the organic material is an epoxy based dielectric.

5. The electronic circuit package of claim 1, wherein the dendrites are formed to a height of approximately 2 mils.

6. The electronic circuit package of claim 1, wherein the dendrites are made of palladium material.

7. The electronic circuit package of claim 1, wherein the dendrites protrude approximately 0.5 mil. above the top of the dielectric insulation material.

8. The electronic circuit package of claim 1, wherein the dielectric insulation material is an epoxy based dielectric.

9. The electronic circuit package of claim 1, wherein the second conductive surface is a second surface metal.

10. The electronic circuit package of claim 9, wherein the second surface metal is circuitized.

11. The electronic circuit package of claim 9, wherein the second surface metal is made of a copper material.

12. The electronic circuit package of claim 1, wherein the second conductive surface is a C4 solder ball array.

13. The electronic circuit package of claim 12, further comprising a chip directly connected to the array.

14. The electronic circuit package of claim 13, wherein the chip is directly connected by mechanical force.

15. The electronic circuit package of claim 13, further comprising an organic curable encapsulant filling the area under the chip.

16. The electronic circuit package of claim 15, wherein the encapsulant is a filled epoxy based or cyanate ester based encapsulant.

17. The electronic circuit package of claim 1, wherein the second conductive surface is a ball grid array.

18. The electronic circuit package of claim 17, further comprising a chip directly connected to the array.

19. The electronic circuit package of claim 18, wherein the chip is directly connected by mechanical force.

20. The electronic circuit package of claim 18, further comprising an organic curable encapsulant filling the area under the chip.

21. The electronic circuit package of claim 20, wherein the encapsulant is a filled epoxy based or cyanate ester based encapsulant.

* * * * *